United States Patent
Lauther

(10) Patent No.: US 9,319,064 B2
(45) Date of Patent: Apr. 19, 2016

(54) METHOD FOR CODING A DATA STREAM

(71) Applicant: Ulrich Lauther, München (DE)

(72) Inventor: Ulrich Lauther, München (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/411,504

(22) PCT Filed: May 24, 2013

(86) PCT No.: PCT/EP2013/060698
§ 371 (c)(1),
(2) Date: Dec. 27, 2014

(87) PCT Pub. No.: WO2014/001001
PCT Pub. Date: Jan. 3, 2014

(65) Prior Publication Data
US 2015/0162936 A1 Jun. 11, 2015

(30) Foreign Application Priority Data
Jun. 27, 2012 (DE) .......................... 10 2012 211 031

(51) Int. Cl.
*H03M 7/34* (2006.01)
*H03M 7/42* (2006.01)
(Continued)

(52) U.S. Cl.
CPC *H03M 7/42* (2013.01); *H03M 7/30* (2013.01); *H03M 7/40* (2013.01)

(58) Field of Classification Search
CPC ... H03M 7/4006; H03M 7/30; H03M 7/3059; H03M 13/2957; H03M 7/3088
USPC ...................... 341/51, 87, 106, 107
See application file for complete search history.

(56) References Cited

U.S. PATENT DOCUMENTS 6,026,198 A * 2/2000 Okada .................... G06T 9/005
341/107

(Continued)

FOREIGN PATENT DOCUMENTS

| JP | 2000137497 A | 5/2000 |
| JP | 2002533005 A | 10/2002 |
| JP | 2009501943 A | 1/2009 |

OTHER PUBLICATIONS

German Office Action for German Application No. 10 2012 211 031.3, mailed Mar. 4, 2014, with English Translation.
(Continued)

*Primary Examiner* — Linh Nguyen
(74) *Attorney, Agent, or Firm* — Lempia Summerfield Katz LLC

(57) ABSTRACT

The invention relates to a method for coding a data stream (DS), wherein the data stream (DS) comprises a multiplicity of characters which are symbols (S) from an alphabet, wherein the characters of the data stream (DS) are combined to form a plurality of blocks (B), and the blocks (B) are entropy-coded on the basis of a code table (CT) valid for the respective block (B). The method according to the invention is characterized by the fact that the blocks (B), by means of iteration (IT), are associated with a plurality of clusters (CL) on the basis of a clearance (d) which is defined such that the clearance (d) between a block (B) and a cluster (CL) is smaller the less pronounced the change in the entropy (ET) of the cluster (CL) when adding the block (B) to the cluster (CL). In a respective iteration step, of the iteration (IT), reassignment of the blocks (B) to the clusters (CL) takes place by virtue of the blocks (B) being assigned in each case to the cluster (CL) with the smallest clearance (d) between the block (B) and the cluster (CL). Then, in each case one code table (CT) is assigned to the clusters (CL) determined by the iteration (IT), which code table is determined on the basis of the frequency distribution of the symbols (S) in at least some of the blocks (B) contained in the respective cluster (CL) and is valid for all blocks (B) of the respective cluster (CL).

14 Claims, 1 Drawing Sheet

(51) Int. Cl.
    *H03M 7/30*     (2006.01)
    *H03M 7/40*     (2006.01)

(56) References Cited

U.S. PATENT DOCUMENTS

| | | | |
|---|---|---|---|
| 6,404,931 B1 | 6/2002 | Chen et al. | |
| 6,959,300 B1* | 10/2005 | Caldwell | G06F 17/30286 |
| 7,599,840 B2 | 10/2009 | Mehrotra et al. | |
| 7,689,051 B2* | 3/2010 | Mukerjee | H04N 19/105 |
| | | | 341/51 |
| 8,112,624 B2* | 2/2012 | Parkinson | G06F 21/33 |
| | | | 709/247 |
| 2005/0179572 A1* | 8/2005 | Winger | H03M 7/4006 |
| | | | 341/107 |
| 2007/0016418 A1 | 1/2007 | Mehrotra et al. | |
| 2008/0252498 A1* | 10/2008 | Said | H03M 7/30 |
| | | | 341/107 |
| 2009/0193045 A1* | 7/2009 | Werner | H03M 7/30 |
| 2010/0085224 A1* | 4/2010 | Monro | H03M 7/3082 |
| | | | 341/107 |
| 2011/0179341 A1* | 7/2011 | Falls | H03M 7/3086 |
| | | | 714/807 |
| 2013/0028230 A1* | 1/2013 | Borran | H04W 16/10 |
| | | | 370/329 |
| 2013/0187798 A1* | 7/2013 | Marpe | H03M 7/4081 |
| | | | 341/67 |

OTHER PUBLICATIONS

Golchin Farshid et al; "Minimum-Entropy Clustering and its Application to Lossless Image Coding"; Proceedings of International COnference on Image Preocessing; vol. 2; pp. 262-265; ISBN: 978-0-81-868183-7; DOI: 10.1109/ICIP.1997.638738; XP055070477; 1997; Oct. 26, 1997.

Haifeng Li et al; "Minimum Entropy Clustering and Applications to Gene Expression Analysis"; Computational Systems Bioinformatics Conference, Proceedings, Aug. 16-19, 2004; pp. 142-151;; 2004.

Kattan A. et al; "Evolution of human-competitive lossless compression algorithms with GP-zip2"; Genetic Programming and Evolvable Machines; Springer Science+Business Media; vol. 12; No. 1; DOI 10.1007/s10710-011-9133-6; 2011.

Kattan A.; "Universal Intelligent Data Compression Systems: A Review"; Computer Science and Electronic Engineering Conference (CEEC), Sep. 8-9, 2010; pp. 1-10;; 2010; GB.

PCT International Search Report and Written Opinion of the International Searching Authority dated Jul. 17, 2013 for corresponding PCT/EP2013/060698.

PCT International Search Report and Written Opinion of the International Searching Authority dated Jun. 2, 2014 for corresponding PCT/EP2013/060698.

Yongjin L. et al; "Minimum Entropy, k-Means, Spectral Clustering" IEEE International Joint Conference on Neural Networks, Proceedings 2004; Jul. 25-29, 2004; vol. 1; pp. 117-122; 2004.

Japanese Office action for related Japanese Application No. 2015-518931, dated Dec. 14, 2015 with English Translation.

\* cited by examiner

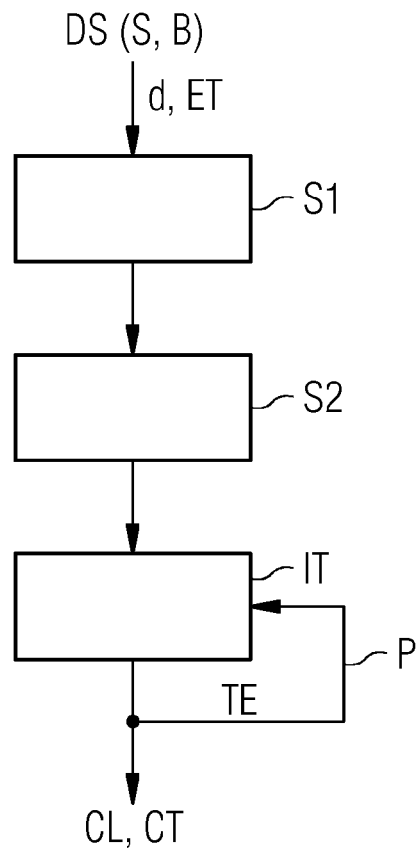
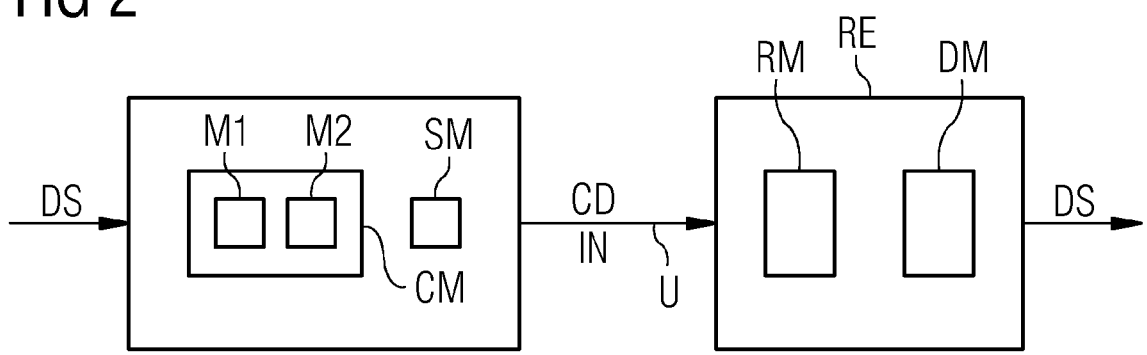

METHOD FOR CODING A DATA STREAM

This application is the National Stage of International Application No. PCT/EP2013/060698, filed May 24, 2013, which claims the benefit of German Patent Application No. DE 10 2012 211 031.3, filed Jun. 27, 2012. The entire contents of these documents are hereby incorporated herein by reference.

BACKGROUND

The present embodiments relate to a method for coding a data stream a corresponding coding device and a transmitting apparatus, and a method and an apparatus for transmitting a data stream.

It is known practice from the prior art to compress a data stream in a lossless manner using entropy coding. In this case, relatively short codes are assigned to symbols in the data stream that occur relatively often, with the result that the total length of the coded data stream is reduced. The corresponding symbols are assigned to codes based on a code table that allocates the corresponding codes to the symbols. Since the frequency of symbols in different sections of a data stream may be different, possibly different code tables may be used for different sections or blocks of the data stream. Since the code tables are to be transmitted to the corresponding decoder in order to decode the data stream, the number of the tables may be suitably restricted.

The document by Farshid Golchin et al: "Minimum-entropy clustering and its application to lossless image coding," PROC. OF INT. CONF. ON IMAGE PROCESSING, vol. 2, Oct. 26, 1997, pages 262-265, discloses entropy coding in which the blocks to be coded are iteratively assigned to clusters. The allocation to the clusters is carried out such that the entropy of the respective cluster is as small as possible. The blocks belonging to the respective cluster are entropy-coded based on the probability distribution of the symbols in the respective cluster.

SUMMARY AND DESCRIPTION

The scope of the present invention is defined solely by the appended claims and is not affected to any degree by the statements within this summary.

A data stream is to be efficiently coded with a restricted number of code tables.

The present embodiments may obviate one or more of the drawbacks or limitations in the related art. For example, a data stream is coded in a lossless manner with a high compression rate using code tables.

The method according to one or more of the present embodiments is used to code a data stream having a number of characters that are symbols from an alphabet. For example, the characters may be corresponding ASCII symbols that are represented using suitable bit sequences in the data stream. The characters in the data stream are combined to form a plurality of blocks including a plurality of successive characters in the data stream. In this case, the blocks are entropy-coded based on a code table valid for the respective block.

Within the scope of the method, the blocks are assigned to a plurality of clusters using an iteration based on a clearance that is defined such that the clearance between a block and a cluster is smaller the smaller the change (e.g., in terms of magnitude) or increase in the entropy of the cluster when adding the block to the cluster. In this case, the blocks are reassigned to the clusters in a respective iteration of the iteration by respectively assigning the blocks to the cluster with the shortest distance between the block and the cluster. In this case, the clearance between a block and a cluster, to which the block is currently assigned, is determined such that the clearance between the block and the cluster is determined without this block.

The above term of entropy is sufficiently well known to a person skilled in the art. Entropy is the measure of the average information content of the characters that are used in a cluster and are symbols from an alphabet. In this case, the entropy for a cluster including one or more blocks, which includes a total of n characters from a set of symbols s, is defined as follows:

$$ET = -\sum_s f(s) * \log_2(f(s)/n),$$

ET denotes the entropy,
the symbols s occurring in the cluster are summed, and
f(s) denotes the frequency of the corresponding symbol s in the cluster.

In the method according to one or more of the present embodiments, a code table is respectively assigned to the clusters determined by the iteration. The code table is determined based on the frequency distribution of the symbols in at least some of the blocks contained in the respective cluster and, for example, the symbols in all blocks contained in the respective cluster and is valid for all blocks in the respective cluster.

The method according to one or more of the present embodiments combines blocks with a similar frequency distribution to form clusters using a suitable entropy-based clearance, with the result that lossless entropy coding with high compression efficiency is achieved using accordingly determined code tables for the blocks in a cluster. In this case, the clustering is achieved based on an iteration that is based on the k-means algorithm known from the prior art and now used for the first time with an entropy-based clearance in the field of data coding.

In one embodiment of the method, the iteration is initialized such that a plurality of clusters each including a block are determined, and the remaining blocks (e.g., the blocks that have not yet been assigned to any clusters) are then respectively assigned to the cluster with the smallest clearance between the block and the cluster. In this case, the plurality of clusters correspond to k clusters (k≥2). In this case, k is the constantly predefined number of clusters to be formed and therefore corresponds to the number of code tables.

In one simple variant of the above initialization of the iteration, which is not part of the present embodiments, the plurality of clusters each including a block are randomly determined. However, alternatively or additionally, in one or more of the present embodiments, the block with the smallest entropy in the data stream may be determined, and a cluster may be formed from this block. Blocks with a minimum clearance from the already existing clusters that is at a maximum are then gradually determined. A further cluster is formed, for a determined block, from this determined block until the number of clusters each including a block is present.

In another embodiment of the method, the total entropy is determined as the sum of the entropies of all clusters in each iteration, and the iteration is terminated if the difference between the total entropy determined in the respective iteration and the total entropy determined in the preceding iteration is lower than a predetermined threshold. Additionally or alternatively, a maximum number of iterations may be predefined as a criterion for terminating the iteration. The iteration is terminated if the maximum number of iterations is exceeded.

The entropy coding carried out within the scope of the method according to one or more of the present embodiments with the aid of code tables may be based on any desired lossless coding method. In one variant, the entropy coding is carried out using the Huffman coding which is known per se.

The method according to one or more of the present embodiments may be used to code any desired data streams. In one variant, the data stream contains software update data (e.g., for a mobile telephone). This data may be used to bring the software of a corresponding device up to date. In this case, the software update data may contain the difference between the old software and the new up-to-date software.

In addition to the coding method described above, one or more of the present embodiments also relates to a coding device for coding a data stream. The data stream includes a number of characters that are symbols from an alphabet. The characters in the data stream are combined to form a plurality of blocks. The coding device is intended to subject the blocks to entropy coding based a code table valid for the respective block.

The coding device according to one or more of the present embodiments includes a device for assigning the blocks to a plurality of clusters using an iteration based on a clearance that is defined such that the clearance between a block and a cluster is smaller the smaller the increase in the entropy of the cluster when adding the block to the cluster. The blocks are reassigned to the clusters in a respective iteration of the iteration by respectively assigning the blocks to the cluster with the smallest clearance between the block and the cluster. The coding device also includes a device for respectively assigning a code table to the clusters determined by the iteration. The code table is determined using the device for respectively assigning a code tabel to the clusters based on the frequency distribution of the symbols in at least some of the blocks contained in the respective cluster and, for example, the symbols in all blocks contained in the respective cluster, and is valid for all blocks in the respective cluster.

The coding device according to the one or more of the present embodiments may be configured such that one or more of the variants of the method may be carried out using the coding device.

One or more of the present embodiments also relates to a method for emitting a data stream. The data stream is coded using the method described above. The coded data stream and the accordingly determined code tables for the plurality of clusters, and the information relating to the blocks for which the code tables are valid are then emitted.

One or more of the embodiments also relates to a transmitting apparatus for emitting a data stream. The transmitter includes the coding device described above and a device for emitting the data stream coded using the coding device and the code tables for the plurality of clusters and the information relating to the blocks for which the code tables are valid.

One or more of the present embodiments also relate to a method for transmitting a data stream. The data stream is emitted using the transmitting method described above and is received by a receiving apparatus that decodes the coded data stream with the aid of the code tables for the plurality of clusters and the information relating to the blocks for which the code tables are valid.

One or more of the present embodiments also relates to an apparatus for transmitting a data stream. The apparatus includes the above-described transmitting apparatus for emitting the data stream and a receiving apparatus with a receiving device for receiving the coded data stream and the code tables for the plurality of clusters and the information relating to the blocks for which the code tables are valid. The receiving apparatus also includes a decoding device for decoding the coded data stream with the aid of the code tables and the information relating to the blocks for which the code tables are valid.

BRIEF DESCRIPTION OF THE DRAWINGS

Exemplary embodiments are described in detail below using the accompanying figures, in which:

FIG. 1 shows a schematic illustration of a determination of clusters that is carried out within the scope of one embodiment of a method; and FIG. 2 shows a schematic illustration of a system in which a data stream is coded by a transmitting apparatus based on a method according to an embodiment and is emitted and received and decoded in a receiving apparatus.

DETAILED DESCRIPTION

Within the scope of an embodiment of a method described here, a data stream representing a number of characters in the form of symbols from an alphabet (e.g., ASCII symbols) is coded using lossless entropy coding. In this case, a plurality of successive characters in the data stream are combined to form blocks. Each block is entropy-coded using a corresponding code table. In this case, corresponding code words are assigned to the symbols using a code table of the block based on the frequency distribution of the symbols. In other words, the less often a symbol occurs in the corresponding block, the shorter the code word. This lossless entropy coding is known from the prior art, and Huffman coding is used in one embodiment. A plurality of blocks with a similar frequency distribution are to be combined in a suitable manner to form clusters, and a code table is always created only for a respective cluster. This makes it possible to achieve efficient coding with maximum compression.

The assignment of the individual blocks in the data stream to clusters is described below using FIG. 1. As the input variable, the data stream DS is processed. The data stream contains corresponding characters in the form of symbols S that are combined to form a plurality of blocks B. Within the scope of the method described here, a corresponding clearance d and an entropy ET are taken into account and are used to assign blocks to clusters, as explained in more detail below. The assignment of the blocks to clusters is based on the k-means algorithm that is known from the prior art and is used for the first time in the field of entropy coding and based on a special, entropy-dependent clearance.

The aim of the k-means algorithm is generally to minimize the sum of the distances between objects and the centroid of a respective cluster. For this purpose, in a plurality of iterations, each object is assigned to the cluster with a centroid that is closest. At the end of each iteration, the cluster centroids (e.g., average value of the corresponding objects in the cluster) are recalculated. A suitable distance definition is provided for this purpose. Within the scope of the method according to one or more of the present embodiments, the objects are represented by the corresponding blocks in the data stream to be coded, and the distance is defined based on the increase in terms of magnitude in the entropy of a cluster when adding a block to the cluster. Blocks having a similar frequency distribution of the symbols are combined using such an entropy-based distance function, with the result that the use of the same code table for blocks in a cluster results in particularly good compression.

The entropy of a block or a cluster is a variable that is sufficiently well known from the prior art and is a lower limit for the compressibility of the corresponding symbols in the block or cluster. In the case of a high entropy value, all of the symbols occurring in the block or cluster have a similar frequency. In contrast, in the case of a low entropy value, few symbols occur with great frequency.

Mathematically, the entropy ET of a block or a cluster including n characters each represented by a corresponding symbol s may be described as follows based on the frequency f(s) of a symbol s contained in the block or cluster:

$$ET = -\sum_{s} f(s) * \log(f(s)/n). \quad (1)$$

Here and below, log denotes the logarithm to the base 2. In this case, all of the symbols s occurring in the block or cluster are summed. In a manner equivalent to this equation, the entropy may also be written as follows:

$$ET = n\log(n) - \sum_{s} f(s) * \log(f(s)). \quad (2)$$

If a block b including $n_b$ characters is now added to a cluster c including $n_c$ characters, the combined entropy increases by the following amount:

$$\delta_{c,b} = (n_c + n_b)\log(n_c + n_b) - (n_c)\log(n_c) - \quad (3)$$
$$\sum_{s_b} ((f_c(s_b) + f_b(s_b))\log(f_c(s_b) + f_b(s_b)) - f_c(s_b)\log(f_c(s_b))).$$

$f_b(s_b)$ corresponds to the frequency of a corresponding symbol $s_b$ occurring in block b in block b, and $f_c(s_b)$ corresponds to the frequency of a corresponding symbol $s_b$ occurring in block b in cluster c. In this case, the last term from the above equation is dispensed with if $f_c(s_b)=0$. The above variable $\delta_{c,b}$ represents the change in the entropy of a cluster c when adding the block b to the cluster c and is one embodiment of a clearance. In FIG. 1, this clearance is denoted by reference symbol d. The clearance $\delta_{c,b}$ just described is used in the iteration according to the k-means algorithm described further below.

According to FIG. 1, before the iteration IT based on the k-means algorithm is actually carried out, a suitable initialization is carried out in acts S1 and S2. Based on a predefined number k of code tables to be created, k clusters each including an individual block are formed in act S1 of the initialization. In the embodiment described here, a search is carried out in this case for the blocks that are far apart from one another according to the above clearance $\delta_{c,b}$. In this case, a search is carried out for the block in the data stream that has the smallest entropy. This block forms the first cluster. A search is then carried out (k-1) times for a block with a minimal distance to clusters that have already been formed that is at a maximum. A new cluster is formed from this block.

Act S1 just described and also the further method acts are represented below by suitable pseudo codes. Comments in the pseudo codes are represented by two forward slashes. The entropy variable (b) in the pseudo codes corresponds to the entropy ET defined above for a corresponding block b. The distance variable (b, c) likewise corresponds to the clearance d or $\delta_{c,b}$ between a block b and a cluster c, as defined above.

The pseudo code for the above act S1 is as follows:

```
Create list of free blocks which have not been assigned to any
    clusters;
min_entropy = ∞;
for all blocks b from the list {
    e = entropy (b);
    if (e < min_entropy) {
        min_entropy = e;
        min_block = b;
    }
}
Create cluster c₁ containing block min_block;
Delete min_block from the list of free blocks;
max_dist = 0;
for (i = 2 to k) {
    //Find free block from the list with maximum
    //smallest clearance from the clusters:
    for all free blocks b {
        //Find smallest clearance from the clusters:
        min_dist = ∞;
        for all clusters c {
            d = distance (b, c);
            if (d < min_dist) {
                min_dist = d;
                min_block = b;
            }
        }
        if (min_dist > max_dist) {
            max_dist = min_dist;
            max_block = min_block;
        }
    }
    Create cluster cᵢ containing block max_block;
    Delete max_block from list of free blocks;
}
``` k clusters each with a block are therefore obtained after carrying out act S1. In act S2, the remaining blocks that have not yet been assigned to clusters are now allocated to the cluster with the smallest clearance from the respective block. This is achieved based on the following pseudo code:

```
min_dist = ∞;
for all free blocks b {
    for all clusters c {
        d = distance (b, c);
        if (d < min_dist) {
            min_dist = d;
            min_cluster = c;
        }
    }
    Add block b to the cluster min_cluster;
}
```

Act S2 is finally followed by the actual iteration IT. In this case, the blocks are reassigned to the clusters in each iteration act by determining, for each block, the closest cluster based on the entropy-based clearance and shifting the block to this cluster. In order to determine the clearance between a block and the cluster in which the block is currently situated, the clearance between the block and the cluster when the block is removed from the cluster is determined in this case. After a respective iteration act has been carried out, the clusters have changed, with the result that differences in the assignment of the blocks to the clusters may arise in the next iteration act.

The iterative reassignment of the blocks to clusters may be represented by the following pseudo code, in which case the while loop below is run through as long as the variable "change" is set to the state "true":

```
        change = true;
        iter = 0;
        while (change) {
            change = false;
            iter = iter + 1;
            Calculate total entropy old_entropy;
            for all blocks b {
                old_cluster = cluster of b;
                min_dist = ∞;
                for all clusters c {
                    d = distance (b, c);
                    if (d < min_dist) {
                        min_dist = d;
                        min_cluster = c;
                    }
                }
                if (min_cluster != old_cluster) {
                    Shift block b from the old_cluster to
                    new_cluster;
                    change = true;
                }
            }
            Calculate total entropy new_entropy;
            if (|new_entropy - old_entropy| < epsilon || iter >
            max_iter) change = false;
        }
```

In the above pseudo code, the total entropy is determined based on the sum of the entropies of all clusters determined in the respective iteration. In this case, new_entropy represents the total entropy determined in the current iteration step and old_entropy represents the total entropy determined in the preceding iteration. The entropy that is determined in the current iteration and is denoted TE in FIG. 1 is used as a criterion for terminating the iteration IT, which is indicated by the arrow P in FIG. 1. If this current entropy differs from the total entropy of the preceding iteration by less than a predetermined threshold value (e.g., denoted "epsilon" in the pseudo code), the iteration IT is ended since there are no or only slight changes in the total entropy. A maximum number of iterations max_iter is used as a further terminating criterion according to the above pseudo code. If this maximum number of iterations is exceeded, the iteration IT is likewise terminated.

A number of k clusters denoted CL in FIG. 1 is obtained as the result of the method described above. In this case, corresponding blocks from the data stream are assigned to each cluster. All blocks that belong to the same cluster are entropy-coded using the same code table. Consequently, in a next act of the method that is no longer shown in FIG. 1, code tables are created in a manner known per se based on the frequency distributions of the symbols in the blocks belonging to a respective cluster. The code tables are generally denoted CT in FIG. 1. These code tables are then used to assign code words to the symbols in the blocks, thus achieving the entropy coding of the data stream. The coded data stream may then be transmitted, together with the code tables and the assignments of the blocks to the code tables, via a corresponding transmission path and may be decoded by a receiver with the aid of the code tables and the corresponding assignment of the blocks to the tables. A corresponding scenario is illustrated in FIG. 2.

FIG. 2 shows a system according to which the original data stream DS is coded, is transmitted via a transmission path and is then decoded. In this case, the data stream DS is processed by a transmitting apparatus SE. This transmitting apparatus SE includes a coding device CM with corresponding devices M1 and M2 for carrying out the method. In the device M1, the corresponding clusters are determined within the scope of the iteration described above. In the device M2, the suitable code tables are determined based on the frequency distributions of the symbols in the clusters and are assigned to the corresponding blocks. These code tables are then used to carry out the entropy coding in the coding device CM. The coded data stream CD produced thereby is then emitted, together with an item of additional information IN, via a corresponding transmitter SM of the transmitting apparatus SE and is transmitted via a transmission path U. The transmitter SM may include, for example, an antenna, with the result that the coded data stream CD and the information IN are wirelessly transmitted. The information IN contains the accordingly determined code tables and the assignment of the blocks in the data stream to the code tables.

The data stream CD and the information IN are received by a receiving apparatus RE via a corresponding receiver RM. In the case of wireless transmission, the receiver may include a corresponding receiving antenna. The coded data stream is then decoded in a decoding device DM using the code tables contained in the information IN and corresponding assignment to the blocks. The original data stream DS is obtained again. The data stream may be recovered in a lossless manner on account of the entropy coding.

The above-described variants of the method have a number of advantages. Blocks to be coded in the data stream are combined to form clusters with a similar frequency distribution of the symbols using a suitable entropy-based clearance. This may achieve efficient entropy coding of the data stream using corresponding code tables determined for the clusters. In this case, the determination of the clusters is based on a k-means method that has previously not been used in the field of data coding. In comparison with conventional methods in which the data stream is coded with a previously generated set of code tables, better compression results may be achieved.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for coding a data stream, the data stream comprising a plurality of characters that are symbols from an alphabet, the characters in the data stream being combined to form a plurality of blocks, and the plurality of blocks being entropy-coded based on a code table valid for the respective block, the method comprising:
   assigning the blocks to a plurality of clusters using an iteration based on a clearance that is defined such that the clearance between a block and a cluster of the plurality of clusters is smaller the smaller a change in the entropy of the cluster when adding the block to the cluster, the blocks being reassigned to the clusters in a respective iteration step of the iteration by respectively assigning the blocks to the cluster with the smallest clearance between the block and the cluster;

respectively assigning a code table to the clusters determined by the iteration, the code table being determined based on a frequency distribution of the symbols in at least some of the blocks contained in the respective cluster and being valid for all blocks in the respective cluster, wherein the iteration is initialized such that a plurality of clusters comprising a block is determined, and the remaining blocks are respectively assigned to the cluster with the smallest clearance between the block and the cluster.

2. The method of claim 1, wherein the plurality of clusters each comprising a block are randomly determined when initializing the iteration.

3. The method of claim 1, further comprising:
determining the block with the smallest entropy in the data stream when initializing the iteration; and
forming a cluster from the block, blocks having a minimum clearance from the already existing clusters that is at a maximum then gradually being determined, a further cluster being formed, for a determined block, from this determined block until the plurality of clusters each comprising a block are present.

4. The method of claim 1, further comprising:
determining the total entropy as a sum of the entropies of all clusters in each iteration step; and
terminating the iteration when a difference between the total entropy determined in the respective iteration step and the total entropy determined in the preceding iteration step is lower than a predetermined threshold.

5. The method of claim 1, wherein the iteration is terminated when a maximum number of iteration steps is exceeded.

6. The method of claim 1, wherein the blocks are entropy-coded using Huffman coding.

7. The method of claim 1, wherein the data stream comprises software update data.

8. A coding device for coding a data stream, the data stream comprising a plurality of characters that are symbols from an alphabet, the plurality of characters in the data stream being combined to form a plurality of blocks, the coding device operable to subject the blocks to entropy coding based on a code table valid for the respective block, the coding device comprising:
a first means for assigning the blocks to a plurality of clusters using an iteration based on a clearance that is defined such that the clearance between a block and a cluster is smaller the smaller a change in the entropy of the cluster when adding the block to the cluster, the blocks being reassigned to the clusters in a respective iteration step of the iteration by respectively assigning the blocks to the cluster with the shortest distance between the block and the cluster; and
a second means for respectively assigning a code table to the clusters determined by the iteration, the code table being determined using the second means based on a frequency distribution of symbols in at least some of the blocks contained in the respective cluster and being valid for all blocks in the respective cluster.

9. The coding device of claim 8, wherein the plurality of clusters each comprising a block are randomly determined when initializing the iteration.

10. A method for emitting a data stream, the method comprising:
coding the data stream, the data stream comprising a plurality of characters that are symbols from an alphabet, the characters in the data stream being combined to form a plurality of blocks, and the plurality of blocks being entropy-coded based on a code table valid for the respective block, the coding comprising:
assigning the blocks to a plurality of clusters using an iteration based on a clearance that is defined such that the clearance between a block and a cluster of the plurality of clusters is smaller the smaller the change in the entropy of the cluster when adding the block to the cluster, the blocks being reassigned to the clusters in a respective iteration step of the iteration by respectively assigning the blocks to the cluster with the smallest clearance between the block and the cluster; and
respectively assigning a code table to the clusters determined by the iteration, the code table being determined based on a frequency distribution of the symbols in at least some of the blocks contained in the respective cluster and being valid for all blocks in the respective cluster; and
emitting the coded data stream, the code tables for the plurality of clusters, and information relating to the blocks for which the code tables are valid,
wherein the iteration is initialized such that a plurality of clusters comprising a block is determined, and the remaining blocks are respectively assigned to the cluster with the smallest clearance between the block and the cluster.

11. A transmitting apparatus for emitting a data stream, the transmitting apparatus comprising:
a coding device operable to code a data stream, the data stream comprising a plurality of characters that are symbols from an alphabet, the plurality of characters in the data stream being combined to form a plurality of blocks, the coding device operable to subject the blocks to entropy coding based on a code table valid for the respective block, the coding device comprising:
a first means for assigning the blocks to a plurality of clusters using an iteration based on a clearance that is defined such that the clearance between a block and a cluster] is smaller the smaller a change in the entropy of the cluster when adding the block to the cluster, the blocks being reassigned to the clusters in a respective iteration step of the iteration by respectively assigning the blocks to the cluster with the shortest distance between the block and the cluster; and
a second means for respectively assigning a code table to the clusters determined by the iteration, the code table being determined using the second means based on a frequency distribution of symbols in at least some of the blocks contained in the respective cluster and being valid for all blocks in the respective cluster; and
a means for emitting the data stream coded using the coding device, code tables for the plurality of clusters, and information relating to the blocks for which the code tables are valid.

12. A method for transmitting a data stream, the method comprising:
emitting the data stream, the emitting comprising:
coding the data stream, the data stream comprising a plurality of characters that are symbols from an alphabet, the characters in the data stream being combined to form a plurality of blocks, and the plurality of blocks being entropy-coded based on a code table valid for the respective block, the coding comprising:
assigning the blocks to a plurality of clusters using an iteration based on a clearance that is defined such that the clearance between a block and a cluster of the plurality of clusters is smaller the smaller the change in the entropy of the cluster when adding the block to the cluster, the blocks being reassigned to the clusters in a respective iteration step of the iteration by respectively assigning the blocks to the cluster with the smallest clearance between the block and the cluster; and respectively assigning a code table to the clusters determined by the iteration, the code table being determined based on a frequency distribution of the symbols in at least some of the blocks contained in the respective cluster and being valid for all blocks in the respective cluster; and emitting the coded data stream, the code tables for the plurality of clusters, and information relating to the blocks for which the code tables are valid;

receiving, by a receiving apparatus, the data stream, the receiving apparatus decoding the coded data stream with the aid of the code tables for the plurality of clusters and the information relating to the blocks for which the code tables are valid, wherein the iteration is initialized such that a plurality of clusters comprising a block is determined, and the remaining blocks are respectively assigned to the cluster with the smallest clearance between the block and the cluster.

13. An apparatus for transmitting a data stream, the apparatus comprising;

a transmitting apparatus for emitting the data stream, the transmitting apparatus comprising:

a coding device operable to code a data stream, the data stream comprising a plurality of characters that are symbols from an alphabet, the plurality of characters in the data stream being combined to form a plurality of blocks, the coding device operable to subject the blocks to entropy coding based on a code table valid for the respective block, the coding device comprising:

a first means for assigning the blocks to a plurality of clusters using an iteration based on a clearance that is defined such that the clearance between a block and a cluster] is smaller the smaller a change in the entropy of the cluster when adding the block to the cluster, the blocks being reassigned to the clusters in a respective iteration step of the iteration by respectively assigning the blocks to the cluster with the shortest distance between the block and the cluster; and a second means for respectively assigning a code table to the clusters determined by the iteration, the code table being determined using the second means based on a frequency distribution of symbols in at least some of the blocks contained in the respective cluster and being valid for all blocks in the respective cluster; and a means for emitting the data stream coded using the coding device, code tables for the plurality of clusters, and information relating to the blocks for which the code tables are valid; and a receiving apparatus comprising a receiver and a decoder, the receiver operable to receive the coded data stream, the code tables for the plurality of clusters, and the information relating to the blocks for which the code tables are valid, the decoder being operable to decode the coded data stream with the aid of the code tables and the information relating to the blocks for which the code tables are valid.

14. The method of claim 7, wherein the software update data is software update data for a mobile radio telephone.

* * * * *